United States Patent [19]

McIntosh

[11] Patent Number: 4,771,908
[45] Date of Patent: Sep. 20, 1988

[54] EQUIPMENT ENCLOSURE

[75] Inventor: Rennie F. McIntosh, Glasgow, Scotland

[73] Assignee: Unisys Corporation, Blue Bell, Pa.

[21] Appl. No.: 23,016

[22] Filed: Mar. 6, 1987

[30] Foreign Application Priority Data

Mar. 15, 1986 [GB] United Kingdom ............... 8606437

[51] Int. Cl.⁴ .............................................. B65D 6/00
[52] U.S. Cl. .................................... 220/84; 220/81 R; 312/257 SK; 361/390; 361/429
[58] Field of Search ............... 220/4 R, 4 F, 4 C, 76, 220/84; 312/108, 257 R, 257 SK, 257 A; 361/390–391, 395, 399, 428, 429

[56] References Cited

U.S. PATENT DOCUMENTS 3,334,175  8/1967  Vincent ..................... 174/35 MS

FOREIGN PATENT DOCUMENTS 0115742   9/1979  Japan ........................... 220/4 R
2026985   1/1980  United Kingdom ............ 220/84
2044545  10/1980  United Kingdom .
2138213  10/1984  United Kingdom .

Primary Examiner—G. P. Tolin
Assistant Examiner—Greg Thompson
Attorney, Agent, or Firm—Mark T. Starr

[57] ABSTRACT

An equipment enclosure comprises a frame together with a top panel, two side panels, front and rear panels, and front base and rear base panels. The side panels are held to the frame using studs which engage recesses in the frame. The top attached cover rests on a top face of the frame and engages the studs to position the side panels relative to the frame. Front and rear panels are affixed respectively to a front edge and a rear edge of the top panel and affixed at their respective lower ends using the front base panel and the rear base panel. The tolerances are such that outside dimensions of the enclosure are entirely defined by the material engagement between the panels.

18 Claims, 4 Drawing Sheets

EQUIPMENT ENCLOSURE

BACKGROUND OF THE INVENTION

The present invention relates to an enclosure for electronic, data processing and other housed equipment wherein a number of covers or panels are assembled onto a frame.

It is usual to provide electronic and other equipment mounted in a support frame. The frame is then surrounded by panels to provide an enclosure. In cases where the equipment is small, the frame, which is usually made of metal, can be made to fairly precise dimensions. There is no difficulty in fitting panels around the frame. As the equipment becomes larger, the dimensions of the frame become less accurate. Tolerance errors between mounting points on the panels and mounting points on the frame often make it necessary to provide instant modification to either the panel or the frame before the panels can be mounted upon the frame to make the enclosure.

It is known in the art to fabricate the frame itself as an exposed part of the enclosure and to apply panels to open portions thereof. This increases the cost of the frame by adding a requirement for cosmetic acceptability and allows direct electrical access to the equipment in its frame. The latter condition causes problems with electrostatic discharge and radio interference.

The present invention consists in an equipment enclosure comprising: a support frame; a side panel for attachment to a top edge of a side face of the frame to cover the side face; a top panel for covering a top face of the frame with a front edge of the top panel in proximity with a top edge of a front face of the frame and a rear edge of the top panel in proximity with a top edge of a rear face of the frame; a front panel for attachment to the front face of the frame and for attachment to the top panel at the front edge; and a rear panel for attachment to the rear face of the frame and for attachment to the top panel at the rear edge; the front panel and the rear panel being co-operative with the top panel to hold the top panel onto the frame; and the top panel being co-operative with the top edge of the side face of the frame to prevent removal of the side panel from the frame.

An equipment enclosure according to the present invention is made where tolerance build up on the frame does not prevent mounting of the panels. The outer dimensions of the case or enclosure are determined by the interaction between the panels, rather than by the interaction between each panel and its mounting point on the frame.

It is a preferred feature of the present invention that all panels be in contact with the frame by means of elastic members such as gaskets, allowing further movement between the panel and the frame while maintaining mechanical contact.

In the preferred embodiment of the invention hereinafter described, the frame has a pair of side panels mounted on catches which allow those side panels a degree of freedom of movement relative to the frame. A top panel is placed upon a top face of the frame and the side panels contact the edges of the top panel to define the width of the enclosure. Thereafter, front and rear panels are attached first to front and rear edges of the top panel and then to the frame. In the preferred embodiment, the front and rear panels are attached to the frame by means respectively of front and rear based panels. The latter panels engage a lower edge respectively of the front and rear panels and are in turn attached to the frame by a releasable locking mechanism. In the preferred embodiment, the top panel can thus have dimensional tolerance with respect to the frame in a forward and backward direction as well as in a side-to-side direction.

BRIEF DESCRIPTION OF THE DRAWINGS

The invention is further explained, by way of an example, by the following description which should be read in conjunction with the appended drawings, in which.

DETAILED DESCRIPTION OF THE INVENTION

Figure 1:
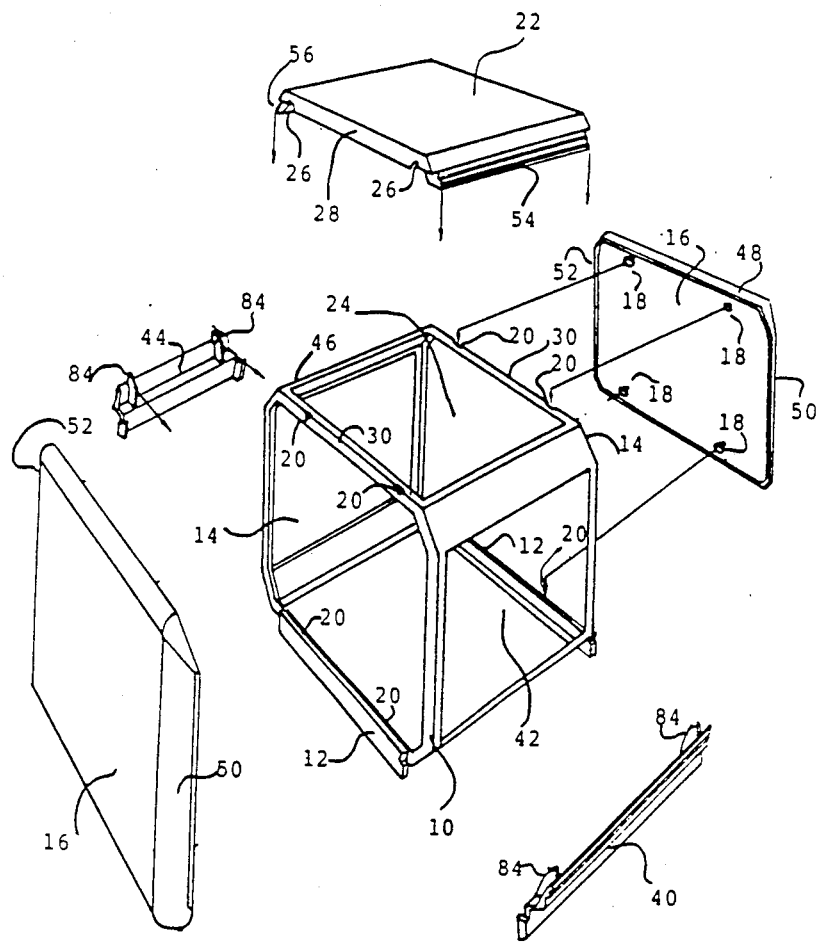
FIG. 1 shows an exploded projected view of an equipment enclosure according to the present invention with all except the front and rear panels present.

FIG. 1 shows an exploded view of a preferred embodiment of an equipment enclosure according to the present invention, lacking only front and rear panels.

A frame 10 is fitted on either side with a side base panel 12 at the lower edge of a side face 14.

A side panel 16 is provided to cover each side face 14 of the frame 10. The side panels 16 are provided with studs 18 for fitting into complementary recesses 20 in the open framework of the frame 10. Although in the preferred embodiment there are shown to be four such studs 18 and recesses 20 associated with each side face 14 of the frame 10, it is to be appreciated that fewer or more than four studs 18 can be so used.

A top panel 22 is positioned upon a top face 24 of the frame 10. Cut-away portions 26 on a side edge 28 of the top panel 22 straddle the studs 18 when the enclosure is assembled (in a manner later described in relation to FIG. 2) to allow movement of the side panels 16 in a direction towards and away from the side faces 14 of the frame 10.

When the enclosure is assembled, side edge 28 of the top panel 22 projects down between the top side edges 30 of the frame 10 and the side panels 16. The side edges 28 of the top panel 22 are given a generally tapered outline in cross section with increasing thickness with increasing height and there is one side edge 28 on the top panel 22 associated with each side of the frame 10. The side edges 28 therefore overhang the frame 10 when the top panel 22 is in place.

Figure 2:
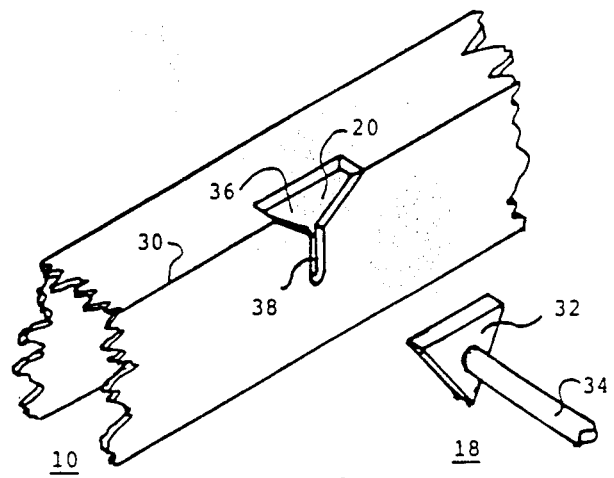
FIG. 2 shows an example of a catch suitable for attaching the side panels of FIG. 1 to the frame of FIG. 1.

FIG. 2 shows a stud 18 and recess 20 suitable for use in the invention, the stud 18 comprising a head 32 on a shank 34.

The side top edge 30 of the frame 10 (which is generally constructed from bent steel sheet) has a pair of recesses 20 formed therein. The recess 20 comprises a recess opening 36 designed to accept and roughly centralize the head 32 of the stud 18. A channel 38 in the lower half of the recess 20 accepts the shank 34 of the stud 18 and allows free movement of 34 over a range of positions within the channel 38. While the head 32 of the stud 18 is shown in this example as being of triangular outline, it is to be appreciated that many other shapes will work. For example, a circular or rectangular head 32 may instead be provided. Likewise, the opening 36 to the recess 20 may be made wider than the head 32 of the stud 18 to accommodate a degree of mismatching between the position of the stud 18 on the side panel 16 and the position of the recess 20 on the frame 10. Similarly, the channel 38 can be made much wider than the shank 34 of the stud 18 to accommodate such mismatching. When the top panel 22 is in position, the cut-away portions 26 thereof pass around the shank 34 of the stud 18 to define the position of the side panel 16 in relation to the top panel 22 without reference to the position of the frame 10.

Returning to FIG. 1, a front base panel 40 is applied to a bottom edge of a front face 42 of the frame 10, and a rear base panel 44 is applied to the bottom edge of a rear face 46 of the frame 10, each in a manner to be described later.

During assembly, the side panels 16 are first applied with the studs 18 in the recesses 20 loosely held against the side face 14 of the frame 10. The top panel 22 is then placed upon the top face 24 of the frame 10 and remains there under the influence of gravity. In being placed upon the top face 24 the side edges 28 of the top panel 22 pass between upper edge portions 48 of the side panel 16 and the top side edges 30 of the frame 10. Top panel 22 moves the side panel 16 away from the side faces 14 of the frame 10 until it is seated on the top face 24 of the frame 10 with one of the side edges 28 of the top panel 22 on either side of the top side edges 30 of the frame 10. The wedge shape of the side edges 28 of the top panel 22 ensures a snug fit no matter what the dimensional tolerances of the frame 10. The cut-away portions 26 in the top panel 22 engage the shanks 34 of the studs 18 in the side panels 16 and thus cause the side panels 16 to move such that the shanks 34 of the stud 18 become centralized in the cut-away portions 26 of the top panel 22. Thus, the side panel 16 and the top panel 22 move into a mutually correct positional relationship despite any mechanical tolerances present upon the frame 10.

When the side panels 16 of the enclosure are in place, a front edge portion 50 of each side panel 16 extends beyond the front face 42 of the frame 10 and a rear edge portion 52 of each side panel 16 extends beyond the rear face 46 of the frame 10.

When the top panel 22 is in place over the top face 24 of the frame 10, a front edge 54 of the top panel 22 overhangs the front face 42 of the frame 10 and a rear edge 56 of the top panel 22 overhangs and extends beyond the rear face 46 of the frame 10.

While here described as being generally constructed of bent sheet metal, the frame 10 can equally well be made from solid metal or plastics or any other suitable material.

Figure 3:
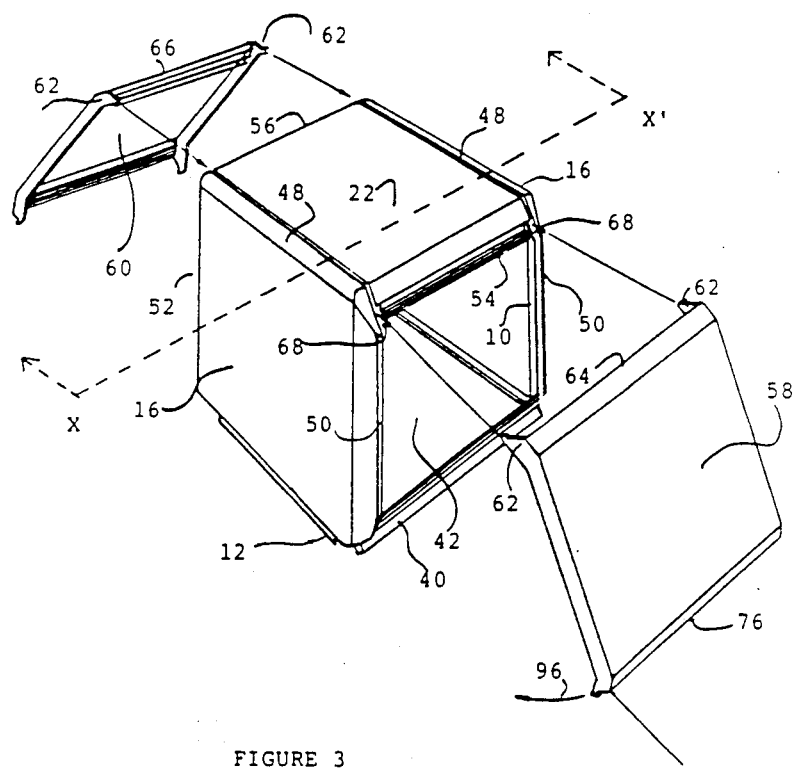
FIG. 3 shows the elements of FIG. 1 assembled and further shows the manner of addition of the front and rear panels.

FIG. 3 shows the elements of FIG. 1 assembled onto the frame 10 as described and further shows a front panel 58 and a rear panel 60 ready for placement.

The top panel 22 traps the studs 18 in the recesses 20 and prevents removal of the side panel 16 while the top panel 22 is in place.

The front panel 58 and the rear panel 60 each include arms 62,64,66. The arms 62 are provided on either side of the front 58 and rear 60 panels and fit into a gap 68 between the front edge 54 of the top panel 22 and the front edge portions 50 of the side panel 16. The arms 62 together with a staircase structure (to be described later with reference to FIG. 4) hold the front panel 58 onto the front edge 54 of the top panel 22.

The rear panel 60 is similarly attached to the rear face 46 of the frame 10 by attachment to the rear edge 56 of the top panel 22.

When in place, the upper surface of the top panel 22 is substantially at the same level as the uppermost part of the top edge portion 48 of each side panel 16. Likewise, it is intended that the outer surface 58 of each of the front 58 and rear 60 panels should be substantially level with the most extreme part respectively of each of the front edge portions 50 and rear edge portions 52 of the side panels 16.

Figure 4:
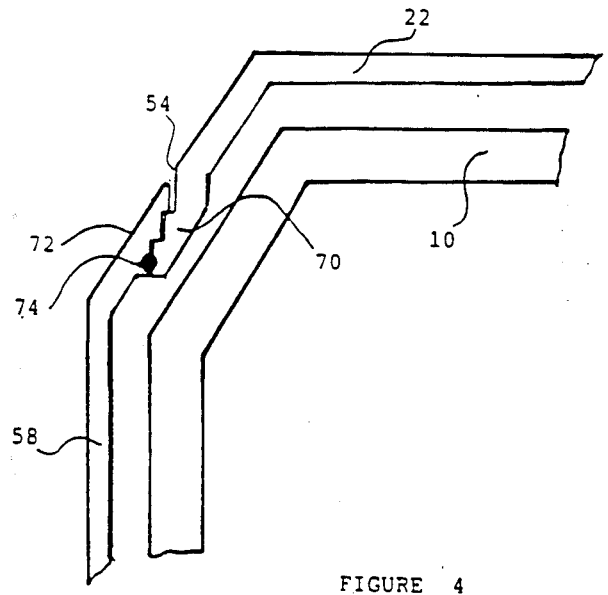
FIG. 4 shows the manner in which the front and rear panels each come together with the top panel. The front and rear panels engage the top panel respectively along the front edge of the top panel and the rear edge of the top panel.

FIG. 4 is a cross-sectional view showing the manner in which the front panel 58 joins with the top panel 22 along the front edge 54 of the top panel 22.

The front edge 54 of the top panel 22 is provided with a tip portion 70 which engages a complementary tip portion 72 of the front panel 58. The tip portion 70 of the top panel 22 comprises a staircase structure at its extreme end which engages a complementary staircase structure at the extreme end of the tip portion 72 of the front panel 58 in such a manner that the top panel 22 provides mechanical support to the front panel 58. The combined action of the arms 62 (FIG. 3) upon ledges or pivots beneath the top cover 22 and the mutually engaging staircase structures in the tip portion 70 of the top panel 22 and the tip portion 72 of the front panel 58 provides a firm support for the front panel 58 on the front edge 54 of the top panel 22, without the front panel 58 being directly attached to the frame 10. The position of the front panel 58 with respect to the front face 42 of the frame 10 is thus defined by the position of the front edge 54 of the top panel 22.

The rear panel 60 is attached to the rear edge 56 of the top panel 22 in a similar manner.

A sealing gasket 74 in the form of a thin rubber or elastic cylindrical body of material is held between the tip portion 70 of the top panel 22 and the tip portion 72 of the front panel 58. This sealing gasket 74 not only provides a seal resistant to ingress of liquid, solid and gaseous contaminants, but also assists in mechanical support of the front panel 58 on the front edge 54 of the top panel 22. The gasket 74 further allows a degree of mutual movement and variability of position between the top panel 22 and the front panel 58 while maintaining the integrity of the enclosure. The mutually engaging staircase structure on the tip portions 70,72 also permit such movement.

A staircase structure of similar type is also provided on the front base panel 40 and the lower edge 76 of the front panel 58 so that the front panel 58 is supported both at the top and bottom by such a staircase structure comprising a sealing gasket 74. The rear panel 60 is similarly provided with staircase structures and the rear base panel 44 also has a complementary structure.

Figure 5:
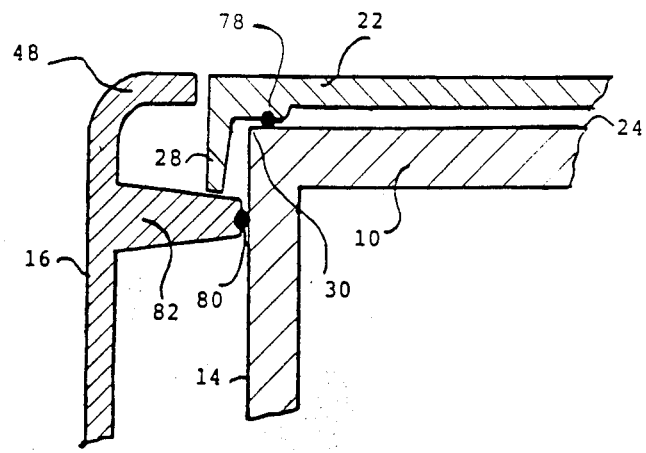
FIG. 5 shows the manner in which the top panel and the side panels engage the frame and one another.

FIG. 5 is a cross-sectional view taken along the line X—X' shown in FIG. 3 looking in the direction of the arrows, and showing the relationship between the side cover 16, the top cover 22 and the frame 10.

A top cover support gasket 78, of rubber or other elastic material, allows the top cover 22 to rest upon the top face 24 of the frame 10 proximate to the top side edges 30 of the frame 10. Likewise, a side panel support gasket 80, again in the form of rubber or other elastic or elastomer material, supports the side panel 16 against the side face 14 of the frame 10. The side panel 16 is provided with a standoff arm or ledge 82. The side edge 28 of the top panel 22 descends between the top edge portion 48 of the side panel 16 and the top side edge 30 of the frame 10 to reach a point close to the standoff arm or ledge 82. The support gaskets 78, 80 extend along the entire length of the frame 10. The combination of the shielding action of the top edge postion 48 of the side panel 16, the shielding action of the side edge 28 of the top panel 22 and of the two gaskets 78, 80 acting against the frame 10 provide further protection against the ingress of foreign matter in the form of solids, liquids or vapors.

Figure 6:
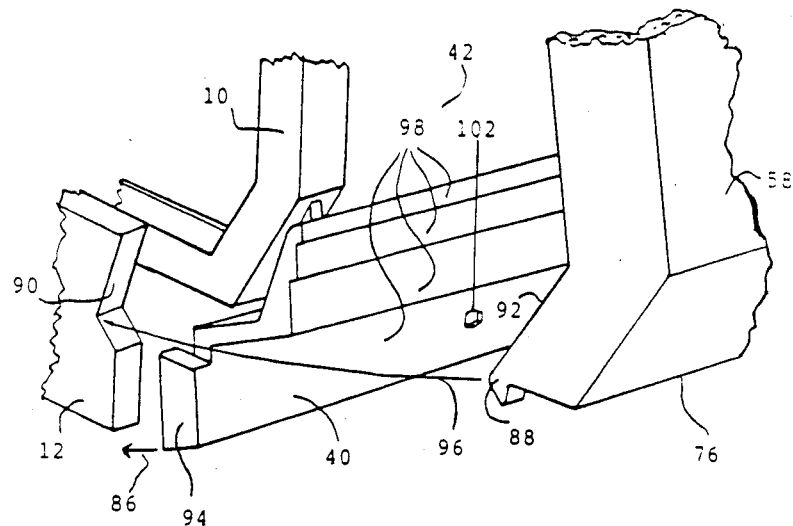
FIG. 6 shows the manner in which either the front or rear panel and the front or rear base panel of the enclosure are brought together to complete assembly of the enclosure.

FIG. 6 shows the manner in which the lower edge 76 of the front panel 58 is attached to the front base panel 40 in cooperation with the side base panel 12.

It should be understood that the rear panel 60 is attached to the rear face 46 of the frame 10 employing the rear base panel 44 and the side base panel 12 in just the same manner. It should be further understood that while FIG. 6 shows just one side of the lower edge 76 of the front panel 58, the other side is held in exactly the same manner as hereinafter described.

Each side of the front base panel 40 and of the rear base panel 44 is provided with a leg 84 (also shown in FIG. 1) which fits into an aperture in the frame 10 on either side of the front 42 or rear 46 face. The aperture forms a void and the leg 84 engages the edges or extremities of the void to allow the front base panel 40 to swing as indicated by the arrow 86. The leg 84 also provides support for the front base panel 40 on the frame 10.

The lower edge 76 of the front panel 58 is provided at its extremity with a projection 88. While the projection 88 is only required to perform the function hereinafter described, it is preferred that the projection 88 should be identical with the arm 62 so that the front panel 58 may be mounted upon the front face 42 of the frame 10 either way up.

The side base panel 12 comprises a recess 90 which accepts the leading edge 92 of the lower edge 76 of the front panel 58. The front base panel 40 comprises a clamp member 94 operative to trap the projection 88 in the recess 90 to hold the front panel 58 in position.

Figure 7:
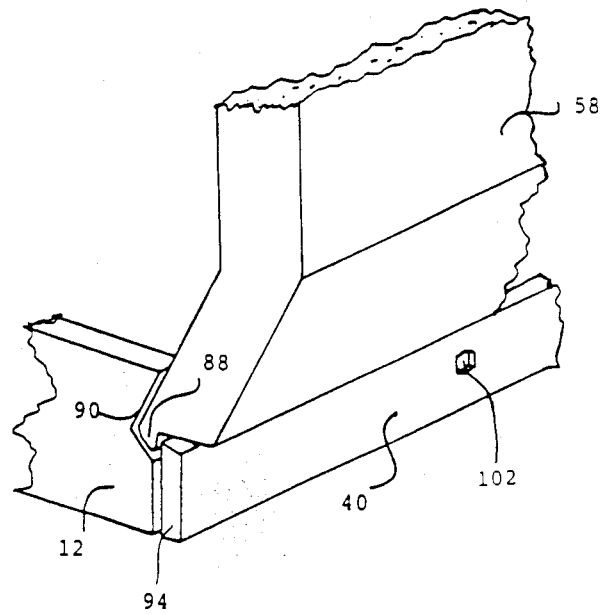
FIG. 7 shows the elements of FIG. 6 in the finally assembled position.

With reference both to FIG. 6 and FIG. 7, the arm 62 on the top edge 64 of the front panel 58 having been inserted into the gaps 68, the front panel 58 is swung as indicated by the arrow 96 such that the projection 88 enter the recess 90 in the side base panel 12 all the time with the front base panel 40 as indicated in FIG. 6 at an angle to its final position such that the clamp member 94 allows passage of the projection 88 into the recess 90 while the leg 84 is in its aperture or void in the frame 10. Thereafter, the front base panel 40 is rotated as indicated by the arrow 86. The clamp member 94 comes up behind the projection 88 and traps the projection 88 in the recess 90 to hold the front panel 58 in position. In entering that position a further staircase structure 98 (also comprising a gasket) engages its complementary staircase structure (not shown in FIG. 6) in the lower edge 76 of the front panel 58 to provide mechanical support as generally indicated in FIG. 4.

The front base panel 40 is provided with a locking device 102 which also comprises a portion (not shown) mounted on the frame 10. The locking device 102 can be of any type. In a preferred embodiment, it may be a simple mechanical key operated lock or a quick release screw device. In this manner, the front base panel 40 may be quickly fixed in place and, if dismantling of the enclosure is required, swung back into the position indicated in FIG. 6 ready to allow disassembly of the enclosure.

When the enclosure is assembled, the front panel 58 rests between the front edge portions 50 of the side panels 16 and the rear panel 60 rests between the rear edge portions 52 of the side panels 16. The separation of the side panels 16 can be defined by engagement of the front edge portions and rear edge portions 50, 52 of the side panels 16 with the edges of the front 58 and rear 60 panels. The overall dimensions of the completed enclosure are thus defined by the mutual engagement of the panels 12, 16, 40, 44, 58, 60 and the frame 10 can be in range of possible positions within the enclosure depending upon the build up of mechanical tolerances between the frame 10 and the panels 16, 22, 40, 44, 58, 60 and between the panels 16, 22, 40, 44, 58, 60 themselves. For example, if the top panel 22 is particularly wide, the separation between the side panels 16 will be decided by the width of the top panel 22. On the other hand, if the top panel 22 is narrower than its specified dimension, and the front or rear panel 58, 60, is the widest, the overall width of the enclosure and the separation between the side panels 16 will be determined by the width of the widest panel 22, 58, 60.

Likewise, if the top panel 22 is longer than its specified dimension, because the front panel 58 and the rear panel 60 are attached to the top panel 22 alone at their respective top edges 64, 66, the front panel 58 will adopt a position spaced from the front face 42 of the frame 10 (the gasket 74 filling any gap between the front panel 58 and the front face 42) and the overall dimensions of the enclosure front to rear will be determined by the length of the top panel 22. The manner of attachment of the lower edge 76 of the front panel 58 (and of the rear panel 60) as shown in FIGS. 6 and 7 allows a degree of angular tolerance in the position of the front panel 58 since only the lower edge 76 is attached. The front panel 58 is therefore able to accomodate the above described tolerances in length of the top panel 22.

The preferred use of the enclosure is for housing data processing equipment including data processor, disk drives, communications devices, power supplies, fans, blowers and the like. It is however to be appreciated that other equipment can be housed in such an enclosure. Examples of such other equipment include small scale laboratory chemical processing equipment, pneumatic equipment and hydraulic equipment.

The frame 10 is preferably mounted upon castors (not shown) and the side base panels 12 and the front 40 and rear 44 base panels together form a plinth allowing the castors freedom to roll while providing visual concealment. If the castors are omitted, the plinth so formed is the overall support for the frame 10 together with concealed feet in place of the castors.

It should be further appreciated that the frame 10 can comprise a base panel for providing an insulated and enclosed support on its lower face.

I claim:

1. An equipment enclosure comprising:
    a support frame;
    a first side panel;
    first means attaching said first side panel to a top edge of a first side face of said frame to cover said first side face;
    a top panel engaged with said first means, said top panel positioned to cover a top face of said frame with a front edge of said top panel in proximity with a top edge of a front face of said frame and a rear edge of said top panel in proximity with a top edge of a rear face of said frame;
    a front panel attached to said front face of said frame and said top panel at said front edge; and
    a rear panel attached to said rear face of said frame and said top panel at said rear edge;
    wherein said front panel and said rear panel cooperate with said top panel to hold said top panel onto said frame;
    wherein said top panel cooperates with said top edge of said first side face of said frame to prevent removal of said first side panel from said frame.

2. An equipment enclosure according to claim 1 further including:
    a second side panel;
    second means attaching said second side panel to a top edge of a second side face of said frame to cover said second side face;
    wherein said top panel engages said second means;
    wherein said top panel cooperates with said top edge of said second side face of said frame to prevent removal of said second side panel from said frame.

3. An enclosure according to claim 2 wherein:
    said first means includes a first stud on said first side panel;
    said top edge of said first side face of said frame comprises a first recess;
    said first side panel is attached to said first side face of said frame with said first stud inserted into said first recess;
    said second means includes a second stud on said second side panel;
    said top edge of said second side face of said frame comprises a second recess;
    said second side panel is attached to said second side face of said frame with said second stud inserted into said second recess; and
    wherein said top panel cooperates with said top edges of said first and second side faces to prevent removal of said first and second studs from said first and second recesses.

4. An enclosure according to claim 1 further comprising a front base panel attached to a lower edge of said front face of said frame with said front base panel in engagement with a lower edge of said front panel to provide attachment of said front panel to said front face.

5. An enclosure according to claim 1 wherein said first means includes a stud on said first side panel; wherein said top edge of said first side face of said frame comprises a recess; wherein said first side panel is attached to said first side face of said frame with said stud inserted into said recess; and wherein said top panel cooperates with said top edge of said first side face to prevent removal of said stud from said recess.

6. An enclosure according to claim 4 further comprising a side base panel attached to a lower edge of said first side face; said side base panel including a recess accepting a projection at said lower edge of said front panel; said front base panel trapping said projection in said recess to provide attachment of said front panel to said frame.

7. An enclosure according to claim 1 wherein said frame is located within said enclosure.

8. An enclosure according to claim 6 wherein said first side panel comprises an upper edge portion which projects above said upper edge of said first side face and is contiguous with a first side edge of said top panel.

9. An equipment enclosure according to claim 8 further including:
    a second side panel;
    second means attaching said second side panel to a top edge of a second side face of said frame to cover said second side face;
    wherein said top panel engages said second means;
    wherein said top panel cooperates with said top edge of said second side face of said frame to prevent removal of said second side panel from said frame.

10. An enclosure according to claim 9 wherein:
    said first means includes a first stud on said first side panel;
    said top edge of said first side face of said frame comprises a first recess;
    said first side panel is attached to said first side face of said frame with said first stud inserted into said first recess;
    said second means includes a second stud on said second side panel;
    said top edge of said second side face of said frame comprises a second recess;
    said second side panel is attached to said second side face of said frame with said second stud inserted into said second recess; and
    wherein said top panel cooperates with said top edges of said first and second side faces to prevent removal of said first and second studs from said first and second recesses.

11. An enclosure according to claim 10 wherein said second side panel comprises an upper edge portion which projects above said upper edge of said second side face and is contiguous with a second side edge of said top panel.

12. An enclosure according to claim 8 wherein said first side panel comprises a front edge portion which projects beyond a front edge of said first side face and is contiguous with a side edge of said front panel.

13. An enclosure according to claim 12 wherein said front base panel comprises: a leg inserted into a void in said front face of said frame and engaging extremities of said void; and a catch locking said front base panel to said frame; said leg, said extremities of said void and said catch being cooperative to provide attachment of said lower base panel to said lower edge of said front face.

14. An equipment enclosure according to claim 13 further including:
    a second side panel;
    second means attaching said second side panel to a top edge of a second side face of said frame to cover said second side face;
    wherein said top panel engages said second means;

wherein said top panel cooperates with said top edge of said second side face of said frame to prevent removal of said second side panel from said frame.

15. An enclosure according to claim 14 wherein:
said first means includes a first stud on said first side panel;
said top edge of said first side face of said frame comprises a first recess;
said first side panel is attached to said first side face of said frame with said first stud inserted into said first recess;
said second means includes a second stud on said second side panel;
said top edge of said second side face of said frame comprises a second recess;
said second side panel is attached to said second side face of said frame with said second stud inserted into said second recess; and
wherein said top panel cooperates with said top edges of said first and second side faces to prevent removal of said first and second studs from said first and second recesses.

16. An enclosure according to claim 15 wherein:
said second side panel comprises a front edge portion which projects beyond a front edge of said second side face and is contiguous with a second side edge of said front panel; and
said second side panel comprises an upper edge portion which projects above said upper edge of said second side face and is contiguous with a second side edge of said top panel.

17. An enclosure according to claim 16 wherein said front panel comprises an arm at a top edge of said front panel; and wherein said top panel comprises engaging means engaging said arm to provide attachment of said front panel to said top panel at said front edge.

18. An enclosure according to claim 13 wherein said front panel comprises an arm at a top edge of said front panel; and wherein said top panel comprises engaging means engaging said arm to provide attachment of said front panel to said top panel at said front edge.

* * * * *